United States Patent [19]

Mizugaki et al.

[11] Patent Number: 4,937,782
[45] Date of Patent: Jun. 26, 1990

[54] COUNTER CONTROL METHOD

[75] Inventors: Shigeo Mizugaki; Toyokatsu Nakajima; Kikuo Muramatsu, all of Itami, Japan

[73] Assignee: Mitsubishi Denki Kabushiki Kaisha, Tokyo, Japan

[21] Appl. No.: 142,111

[22] Filed: Jan. 11, 1988

[30] Foreign Application Priority Data

Sep. 30, 1987 [JP] Japan .................. 62-248407

[51] Int. Cl.⁵ .................................. G06F 7/00
[52] U.S. Cl. ........................ 364/900; 364/942.7; 364/925.6
[58] Field of Search ... 364/200 MS File, 900 MS File; 377/2

[56] References Cited

U.S. PATENT DOCUMENTS 4,304,989 12/1981 Vos et al. .................. 377/2
4,321,460 3/1982 Mohammadioun .......... 377/2

OTHER PUBLICATIONS

"Oki 8/16 Bit One–Chip Microcomputer Model MSN 66301", (date unknown).

Primary Examiner—Thomas M. Heckler
Attorney, Agent, or Firm—Townsend and Townsend

[57] ABSTRACT

A counter control method according to the present invention comprising the steps of:
(a) allocating switching information corresponding to counters in need of being simultaneously started among switching information each serving to drive a plurality of switching means, to an address (c) of memory means to which operation control means is accessible at a time, and
(b) driving said switching means using said switching information so allocated to thereby start said plurality of the counters.

4 Claims, 2 Drawing Sheets

F I G. 4
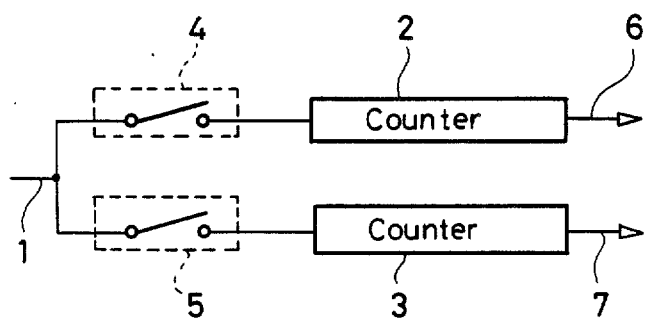
F I G. 5
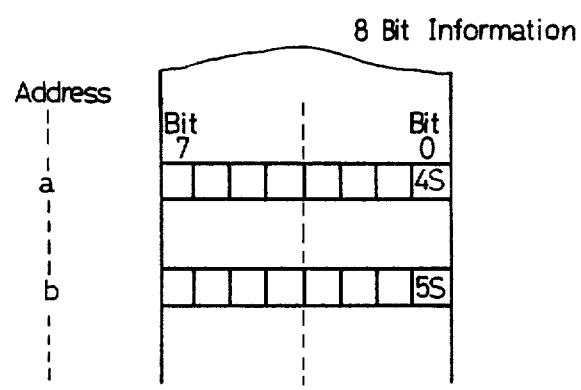

COUNTER CONTROL METHOD

BACKGROUND OF THE INVENTION

1. Field of the Invention

The present invention relates to a counter control method in a microcomputer including a plurality of counters.

2. Description of the Prior Art

FIG. 4 is a block diagram illustrating the start/stop operation for counters included in a microcomputer of this type.

A clock signal (count pulse) transmitted on a signal line 1 from a clock generator (not shown) is input to one terminal of the switching means 4 and 5, which respectively control start/stop operations for the counters 2 and 3. Those counters 2 and 3 are adapted respectively to be different, for example, in their set counts and issue respectively onto signal lines 6 and 7, terminal count signals indicative of the ends of their countings up to the respective set counts.

FIG. 5 is a view of the address configuration of a register for illustrating a prior counter control system. This address configuration is based upon the like configuration of a control register described in the technical sheet of the 8/16 bit 1 chip microcomputer MSM66301 issued from Oki Electric Industry Co., Ltd. As the figure shows, the register has 8 bit information stored therein at its address (a). the bit 0 thereamong including switching information 4S allocated thereto for driving the switching means 4 which serves to start/stop the counter 2. In addition, the register has 8 bit information stored therein at its address (b) in the same manner, the bit 0 thereamong including switching information 5S for driving the switching means 5 which serves to start/stop the counter 3.

In succession, operation of this prior example will be described. The switching means 4 and 5 are closed once the switching information 4S and 5S of a logic level "1" are written in the register at the bits 0 of the respective addresses (a) and (b), for thereby starting the countings by the counters 2 and 3. They are opened once the switching information 4S and 5S of a logic level "0" is written in the register at the bits 0, for thereby stopping the countings by the counters 2 and 3. A central processing unit (operation control means) is assumed here to have a data bit length of 8 bits which are accessible all at one time.

When the central processing unit is needs to start both the counters 2 and 3, for example, using software, it writes data "xxxxxxx1" in the register at the address (a) of FIG. 5. As a result, the switching means 4 of FIG. 4 is closed to thereby start the counting by the counter 2. In succession, the central processing unit writes data "xxxxxxx1" in the same manner at the address (b). Thereupon, the switching means 5 is closed to thereby start the counting by the counter 3. The central processing unit is adapted in such a manner to twice write the data in the register at the addresses (a) and (b) for starting those two counters 2 and 3. That is, the central processing unit starts those two counters by accessing the register twice.

In the prior counter control system, as described above, the need of starting a plurality of counters produced during the associated processing requires a plurality of accesses for writing the information serving to start those counters in the register. In particular, when the object to be controlled requires a higher processing speed, it is needed to control a relative time difference between terminal count signals from the respective counters. Upon this control of the relative time difference, it is necessary to take into consideration not only a difference between the set counts of the counters 2 and 3 but a relative time difference between the first writing (writing of the information for starting the counter 2) and the second writing (that for starting the counter 3). The prior counter control system thus suffers from problems of, for example, complicating the control software to make demonstration of the real time property thereof (that to recognize the time when the central processing unit accesses the register within the whole very short processing time) difficult. So, in order to operate the control object at a very high processing speed, the time difference between the starts of the counters 2 and 3 is subtracted from the absolute time of the start of the counter 3. Hereby, the counters 2 and 3 are operated apparently so as to be simultaneously started. However, provided the event speed of the control object responsive to the terminal count signal is made very high, prior control software is unsatisfactory to operate that control object.

SUMMARY OF THE INVENTION

In view of the drawbacks of the prior system, it is an object of the present invention to provide a counter control method capable of simultaneously starting a plurality of counters by a single access to thereby reduce the load on a control software as well as secure the real time property of the operation.

To achieve the above object, a counter control method according to the present invention comprises the steps of: (a) allocating switching information 4S and 5S corresponding to counters 2 and 3 in need of being simultaneously started among switching information respectively serving to start a plurality of switching means, to an address (c) of memory means (register 14) to which operation control means (central processing unit 11) is accessible at a time, and (b) driving said switching means (4 and 5) with use of said switching information (4S and 5S) so allocated to thereby simultaneously starting said plurality of the counters (2 and 3).

With the counter control method arranged as such, the operation control means (central processing unit 11), when the counters 2 and 3 are needed to be simultaneously started, accesses the switching means 4S and 5S allocated to an address (c) of the memory means (register 14) to close the switching means 4 and 5. Hereby, the counters 2 and 3 start their countings simultaneously. In such a manner, the single access of the operation control means (central processing unit 11) to the memory means (register 14) can assure simultaneous startings of the counters 2 and 3.

The above and other objects, features, and advantages of the invention will become more apparent from the following description when taken in conjuction with the accompanying drawings.

BRIEF DESCRIPTION OF THE DRAWINGS

FIG. 4 is a block diagram illustrating start/stop operations of counters in the present embodiment and in the prior example; and FIG. 5 is a view of the address configuration of a register for illustrating the prior counter control system.

DESCRIPTION OF THE PREFERRED EMBODIMENT

Figure 1:
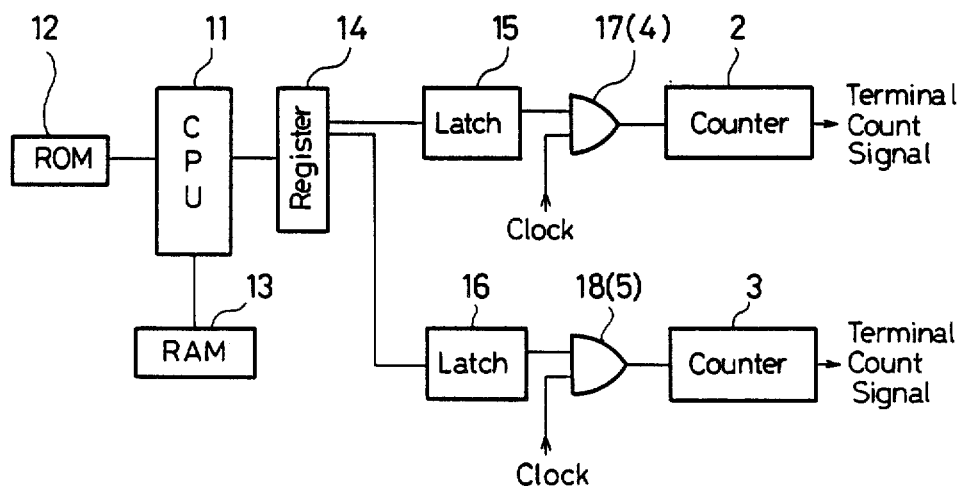
FIG. 1 is a block diagram illustrating the arrangement of a microcomputer using an embodiment of a counter control method according to the present invention.

In what follows, an embodiment of the counter control method of the present invention will be described with reference to the accompanying drawings. FIG. 1 is a block diagram illustrating the arrangement of a microcomputer using the embodiment of a counter control method of the present invention. In addition, FIG. 4 is a block diagram illustrating the start/stop operations of counters shown in FIG. 1.

As FIG. 1 shows, a central processing unit (hereinafter, referred to simply as a CPU.) as operation control means for effecting operation and control for data processing is connected to a read-only memory 12 (hereinafter, referred to simply as a ROM.), a random access memory 13 (hereinafter, referred to simply as a RAM.), and a register 14. The ROM 12 serves as memory means for previously storing information required for the data processing. The RAM 13 serves as memory means for temporarily storing the information required for the data processing. The register 14 serves as memory means for allocating switching information, etc., for controlling the start, stop operations of the counters 2 and 3. The register 14 is further connected to latches 15 and 16, both of which latches respectively latch the respective switching information allocated to the register 14. These latches 15 and 16 are respectively connected to the switching means, e.g., AND gates 17 (4) and 18 (5). These AND gates 17 (4) and 18 (5) serve respectively as gates, i.e., the switching means 4 and 5 shown in FIG. 4, based upon outputs from the latches 15 and 16.

Figure 2:
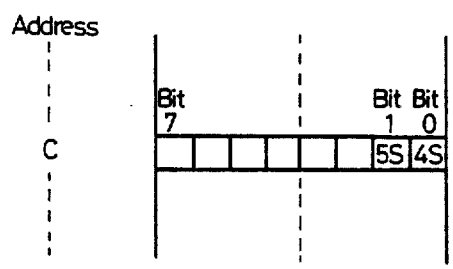
FIG. 2 is a view illustrating the address configuration of a register for illustrating the present embodiment of a counter control method.

FIG. 2 is a view of the address configuration of the register 14 of FIG. 1 illustrating the counter control method of the present embodiment. As the figure shows, the register 14 stores therein 8 bit information at its address C, a bit 0 among the 8 bits including switching information 4s for the start/stop operations of the counter 2 and a bit 1 thereamong switching information 5S for the start/stop operations of the counter 3.

In succession, operation of the present embodiment will be described.

When logic "1"s are written, as the switching information 4S and 5S, on the bit 0 and the bit 1 of the address (C), the switching means 4 and 5 are closed, for thereby starting countings of the counters 2 and 3. Likewise, when logic "0"s are written on the bit 0 and the bit 1, they are opened, for thereby stopping the countings of the counters 2 and 3. In the present embodiment, the CPU 11 has a data bit length of 8 bits, which it can process at a time.

When the CPU 11, which has executed data processing (via software) on the basis of a program stored in the ROM 12, is requested to start only the counter 2, it writes data "xxxxxx01" in the register 14 at its address (c). Accordingly, the switching information 4S of a logic "1" is allocated to the bit 0 of the address (C). The latch 15 therefore latches the switching information 4S and outputs a high level signal to the AND gate 17. The AND gate 17 transmits a clock signal applied thereto at one input thereof to the counter 2 to start it for its counting. The counter 2, after counting predetermined set counts, issues a terminal count signal for use in the associated operation and control. Likewise, once the CPU 11 writes data "xxxxxx10" in the register 14 at its address (C), the latch 16 latches the switching information 5S of a logic "1". The AND gate 18 hereby transmits a clock signal to the counter 3. The counter 3, after counting predetermined set counts, issues a terminal count signal.

Successively, operation of the present embodiment will be described where both the counters 2 and 3 are simultaneously started.

Figure 3:
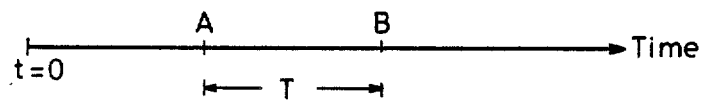
FIG. 3 is a view illustrating the simultaneous startings of the counters in the present embodiment.

The CPU 11 writes data "xxxxx11" in the register 14 at its address (C). Accordingly, the logic "1" switching information 4S is allocated to the bit 0 of the address (C), while the logic "1" switching information 5S is allocated to the bit 1 of the address (C). The latch 15 thus latches the switching information 4S, while the latch 16 latches the switching information 5S. Those switching information 4S and 5S is simultaneously latched in such a manner respectively by the latches 15 and 16, which then output simultaneously the high level signals to thereby permit the counters 2 and 3 to simultaneously start the countings. That is, those counters 2 and 3 simultaneously start their countings at a time instant t=0 shown in FIG. 3 for example. And, the counter 2, after counting the prescribed set counts, issues the terminal count signal at a time instant A, while the counter 3, after counting the like counts, also issues the terminal count signal at a time instant B. Thus, setting of only a relative time difference between those terminal count signals at the time instants A and B can assure a measure for events of the control object for thereby reducing the load on a control software even for the control object operating at a high processing speed.

Moreover, the number of the counters is not limited to two, and may be increased to a data bit length which the CPU can process at a time. For example, a data bit length of 8 bits may allow such counters up to 8, with 16 bits allowing up to 16. In addition, although the above embodiment was described as having 8 bits as the data bit length which the CPU could process at a time, the use of 16 bits or 32 bits will assure writing data in the register at a plurality of addresses (typically continuous ones) only by a single access. It is unnecessary in such a situation to collectively store at a single address switching information serving to control the counters. Ordinarily, storage thereof within a plurality of continuous addresses can assure the same effect. Moreover, although the above embodiment was described as allocating the switching information to addresses of the register to which the CPU was accessible at a time, with the CPU including a register therein, allocation of the switching information to that register to which the CPU is accessible may assure the same effect.

According to the present invention, as described above, switching information is allocated corresponding to counters in need of being simultaneously started, to addresses of the memory means to which the operation control means is accessible at a time, among switching information each serving to drive a plurality of switching means. Hereby, the switching means are driven for simultaneous drive of a plurality of counters. This accordingly allows a relative time difference between the terminal count signals to be described only by a difference of set counts of the counters. Thus, the load on a control software can be reduced, with assurance of the real time property of the associated operation.

What is claimed is:

1. A counter control method in a microcomputer, said micro computer including operation control means, memory means for storing information required for data processing and connected to said operation control means to provide for simultaneous storage of data in said memory in a plurality of addressable bit locations, a plurality of controllable switching means, each switching means connected to the memory means so as to be controllable by a respective addressable bit in said memory means, and a plurality of counters corresponding in number to said plurality of switching means, each counter capable of being controlled in its start operation by a respective one of said plurality of said switching means, said method comprising the steps of:

allocating a first addressable bit of said memory means for control of a first of said switching means;

allocating a second addressable bit of said memory means for control of a second of said switching means, said second addressable bit being allocated such that data can be stored by said control means simultaneously in both said first addressable bit location and said second addressable bit location;

storing, simultaneously, a first bit of data in said first addressable memory bit location, and a second bit of data in said second addressable memory bit location; and controlling said first and second switches, using contents of said first and second memory locations, and controlling start operation of said first and second counters using said first and second switches to thereby simultaneously start said first and second counters.

2. A counter control method, as claimed in claim 1, wherein said memory means includes at least a first register, said register having a plurality of addressable register bits, and wherein said first addressable bit and said second addressable bit are addressable register bits.

3. A counter control method, as claimed in claim 1, wherein said operation control means, said memory means, and said counters are provided on a single chip.

4. A counter control method, as claimed in claim 1, wherein said plurality of controllable switching means includes at least three controllable switching means and further comprising:

allocating a plurality of addressable bits in said memory means for control of all of said plurality of controllable switching means, wherein each of said plurality of allocated addressable bits is usable for control of each of said plurality of controllable switching means.

* * * * *